(12) United States Patent
Chen et al.

(10) Patent No.: US 8,187,948 B2
(45) Date of Patent: May 29, 2012

(54) HYBRID GAP-FILL APPROACH FOR STI FORMATION

(75) Inventors: Neng-Kuo Chen, Sinshih (TW); Chih-Hsiang Chang, Taipei (TW); Kuo-Hwa Tzeng, Taipei (TW); Cheng-Yuan Tsai, Chu-Pei (TW)

(73) Assignee: Taiwan Semiconductor Manufacturing Company, Ltd., Hsin-Chu ( * ) Notice: Subject to any disclaimer, the term of this patent is extended or adjusted under 35 U.S.C. 154(b) by 496 days.

(21) Appl. No.: 12/032,962

(22) Filed: Feb. 18, 2008

(65) Prior Publication Data

US 2009/0209083 A1    Aug. 20, 2009

(51) Int. Cl.
*H01L 21/76* (2006.01)
(52) U.S. Cl. ............. 438/424; 438/433; 257/E21.57
(58) Field of Classification Search ........... 438/424, 438/433; 257/E21.57
See application file for complete search history.

(56) References Cited

U.S. PATENT DOCUMENTS

| | | | |
|---|---|---|---|
| 6,525,392 B1 * | 2/2003 | Leonardi | 257/500 |
| 7,033,945 B2 * | 4/2006 | Byun et al. | 438/700 |
| 7,427,533 B2 | 9/2008 | Lee et al. | |
| 2002/0006729 A1 * | 1/2002 | Geiger et al. | 438/698 |
| 2004/0175957 A1 * | 9/2004 | Lukas et al. | 438/778 |
| 2005/0191828 A1 * | 9/2005 | Al-Bayati et al. | 438/514 |
| 2006/0084256 A1 * | 4/2006 | Cabral et al. | 438/597 |
| 2006/0286713 A1 | 12/2006 | Lee et al. | |
| 2007/0281496 A1 * | 12/2007 | Ingle et al. | 438/778 |
| 2009/0031953 A1 * | 2/2009 | Ingle et al. | 118/723 R |

FOREIGN PATENT DOCUMENTS

| | | |
|---|---|---|
| CN | 1905154 A | 1/2007 |
| KR | 20060131213 A | 12/2006 |

* cited by examiner

*Primary Examiner* — Charles Garber
*Assistant Examiner* — Abdulfattah Mustapha
(74) *Attorney, Agent, or Firm* — Slater & Matsil, L.L.P.

(57) ABSTRACT

A method of forming a shallow trench isolation region is provided. The method includes providing a semiconductor substrate comprising a top surface; forming an opening extending from the top surface into the semiconductor substrate; performing a conformal deposition method to fill a dielectric material into the opening; performing a first treatment on the dielectric material, wherein the first treatment provides an energy high enough for breaking bonds in the dielectric material; and performing a steam anneal on the dielectric material.

19 Claims, 7 Drawing Sheets

HYBRID GAP-FILL APPROACH FOR STI FORMATION

TECHNICAL FIELD

This invention relates generally to integrated circuits, and more particularly to structures and manufacturing methods of shallow trench isolation (STI) regions.

BACKGROUND

Modern integrated circuits are formed on the surfaces of semiconductor substrates, which are mostly silicon substrates. Semiconductor devices are isolated from each other by isolation structures formed on the surface of the respective semiconductor substrates. The isolation structures include field oxides and shallow trench isolation (STI) regions.

Field oxides are often formed using local oxidation of silicon (LOCOS). A typical formation process includes blanket forming a mask layer on a silicon substrate, and then patterning the mask layer to expose certain areas of the underlying silicon substrate. A thermal oxidation is then performed in an oxygen-containing environment to oxidize the exposed portions of the silicon substrate. The mask layer is then removed.

With the down-scaling of integrated circuits, STI regions are increasingly used as the isolation structures. Conventionally, STI regions are often formed using one of the two methods, high-density plasma chemical vapor deposition (HDP) and high aspect-ratio process (HARP) for the gap-filling. The HDP may be used to fill gaps with aspect ratios less than about 6.0 without causing voids. The HARP may be used to fill gaps with aspect ratios less than about 7.0 without causing voids.

FIGS. 1 and 2 illustrate intermediate stages in the formation of an STI region. First, an STI opening is formed in substrate 10, for example, by etching. The STI opening has an aspect ratio, which equals to the ratio of depth D1 to width W1. The aspect ratio becomes increasingly greater when the integrated circuits are increasingly scaled down. For 40 nm technology and below, the aspect ratio will be greater, and sometimes far greater, than 7.0. Oxide 12, preferably a silicon oxide, is filled into the opening, until the top surface of oxide 12 is higher than the top surface of silicon substrate 10.

The increase in the aspect ratio causes problems. Referring to FIG. 1, in the filling of the STI opening, the high aspect ratio will adversely result in the formation of void 14, which is a result of the pre-mature sealing in the top region of oxide 12. After a chemical mechanical polish (CMP) to remove excess oxide 12, STI region 16 is left in the opening, as is shown in FIG. 2. It is likely that void 14 is exposed after the CMP. In subsequent process steps, conductive materials such as polysilicon may be filled into the opening, causing the bridging, and even the shorting of integrated circuits in some circumstances.

When the aspect ratios are high, even if no voids are formed, the central portions (seam) of STI regions formed using HARP are often weak. This is typically caused by the inactivity of $C_2H_5$ terminals in the STI regions. Since the oxides formed by HARP are highly conformal, the sidewall portions eventually join each other, forming seams such as seam 15 in FIGS. 1 and 2. With the inactive $C_2H_5$ terminals, even if the sidewall portions are in physical contact, there are few bonds formed. As a result, the seams are mechanically weak. The seams may be damaged by the CMP processes, which may in turn cause voids after the CMP. When the aspect ratios further increase to greater than 7.0, voids start to appear even if the HARP is used. Accordingly, the existing gap-filling techniques can only fill gaps having aspect ratios less than 7.0 without causing voids or weak seams.

U.S. Pat. No. 7,033,945 teaches a method including the steps of forming a STI opening, partially filling the STI opening with BSG, performing a reflow to re-shape the BSG, performing a dip in HF acid, and then performing a second filling step to fully fill the STI opening. However, such process incurs extra cost of reflowing the BSG, and may also reduce the throughput. New gap-filling methods are thus needed.

SUMMARY OF THE INVENTION

In accordance with one aspect of the present invention, a method of forming a shallow trench isolation region includes providing a semiconductor substrate having a top surface; forming an opening extending from the top surface into the semiconductor substrate; performing a conformal deposition method to fill a dielectric material into the opening; performing a first treatment on the dielectric material, wherein the first treatment provides an energy high enough for breaking bonds in the dielectric material; and performing a steam anneal on the dielectric material.

In accordance with another aspect of the present invention, a method of forming an integrated circuit structure includes providing a semiconductor substrate having a top surface; forming an opening extending from the top surface into the semiconductor substrate; forming a liner oxide in the opening; performing a high aspect-ratio process (HARP) to fill a silicon oxide into at least a portion of the opening, wherein the silicon oxide is over the liner oxide; performing a first treatment on the oxide, wherein the first treatment provides an energy high enough for breaking C—O bonds in the silicon oxide; performing a steam anneal; performing a dry anneal after the steam anneal; and performing a planarization after the first treatment.

In accordance with yet another aspect of the present invention, an integrated circuit structure includes a semiconductor substrate having a top surface; an opening extending from the top surface into the semiconductor substrate; a liner oxide lining the opening; a first oxide filling a bottom portion of the opening, wherein the first oxide has a first etching rate; and a second oxide filling a top portion of the opening. The second oxide has a second etching rate less than the first etching rate. The first and the second oxides are formed of a same oxide, and are free from internal voids and seams.

In accordance with yet another aspect of the present invention, an integrated circuit structure includes a semiconductor substrate having a top surface; an opening extending from the top surface into the semiconductor substrate; a liner oxide lining the opening; a first oxide filling a bottom portion of the opening, wherein the first oxide has a first density; and a second oxide filling a top portion of the opening. The second oxide has a second density greater than the first density. The first and the second oxides are formed of a same oxide, and are free from internal voids and seams.

Advantageously, by using the embodiments of the present invention, shallow trench isolation regions having aspect ratios greater than about 7.0 may be formed without incurring voids and/or seams.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming a shallow trench isolation (STI) region is provided. The intermediate stages in the manufacturing of a preferred embodiment of the present invention are illustrated. The variations of the preferred embodiment are then discussed. Throughout the various views and illustrative embodiments of the present invention, like reference numbers are used to designate like elements.

Figure 1:
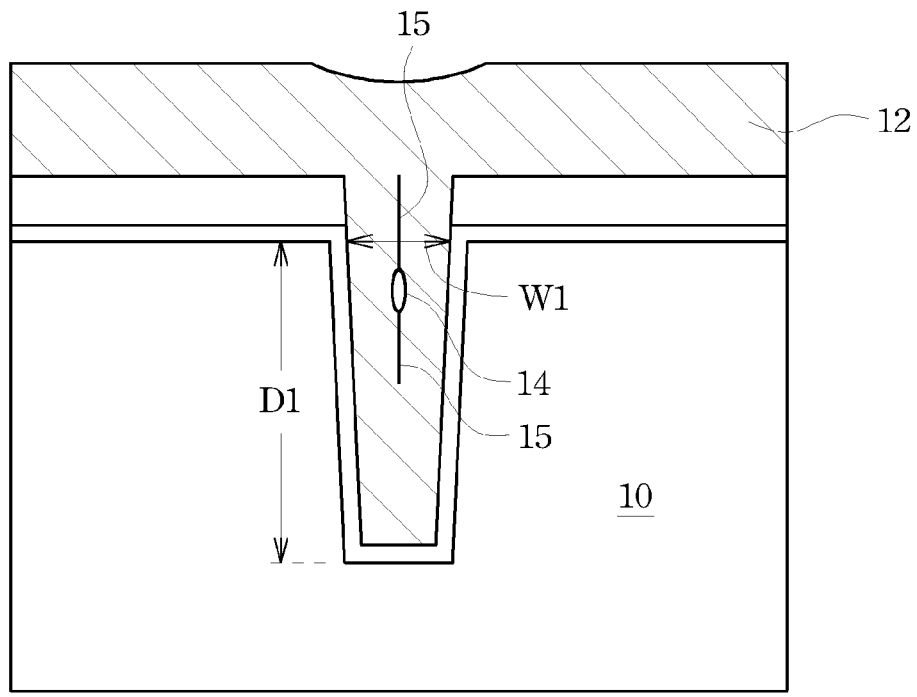
FIGS. 1 and 2 illustrate cross-sectional views in a conventional shallow trench isolation (STI) formation process.
Figure 2:
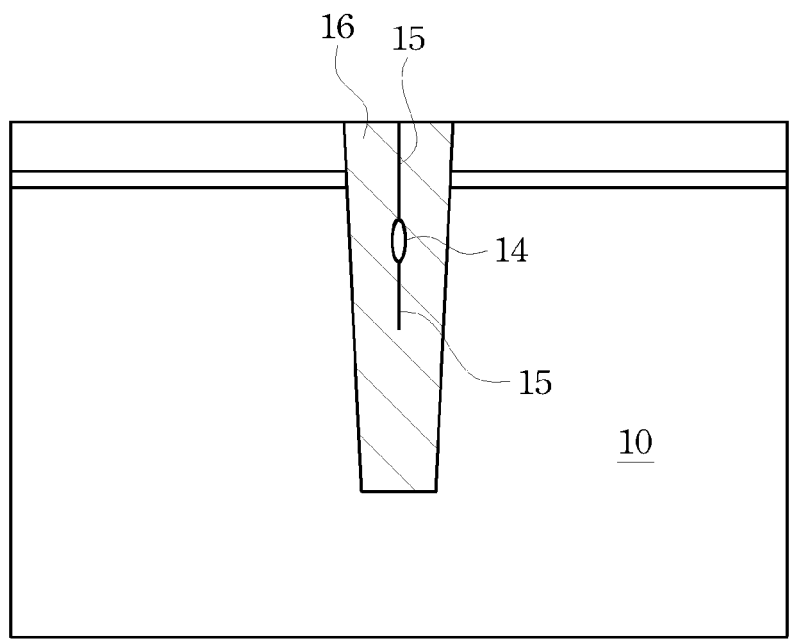
Figure 3:
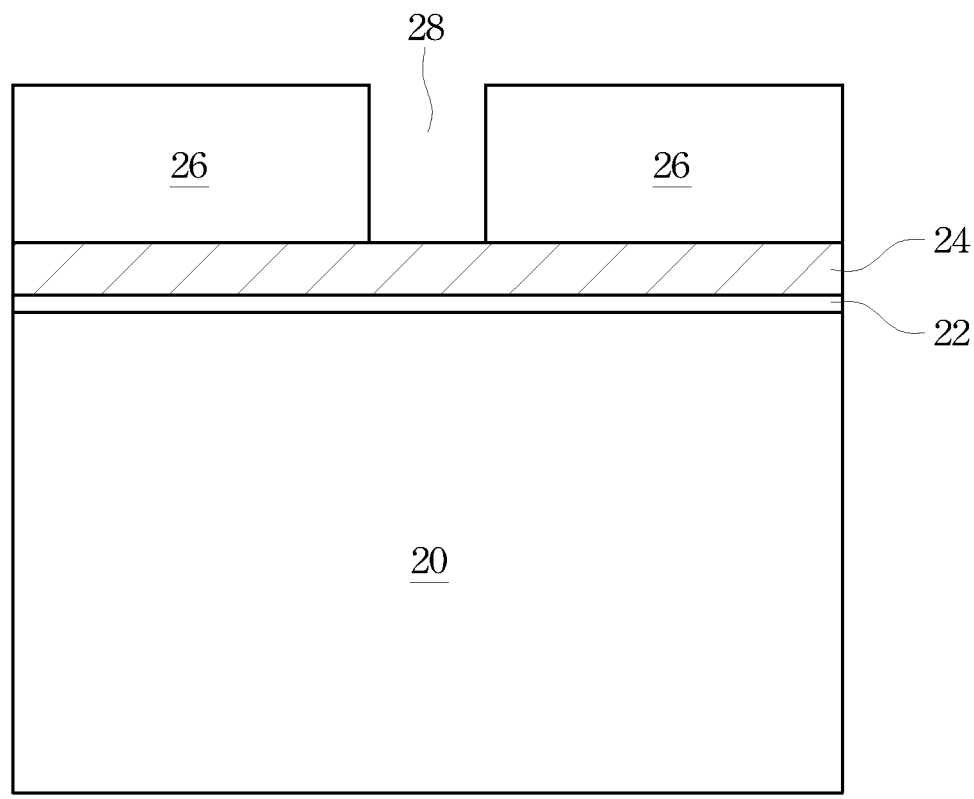
FIGS. 3-6B and 8-10 are cross-sectional views of intermediate stages in the manufacturing of an STI embodiment.

Referring to FIG. 3, semiconductor substrate 20 is provided. In the preferred embodiment, semiconductor substrate 20 includes silicon. Other commonly used materials, such as carbon, germanium, gallium, arsenic, nitrogen, indium, phosphorus, and the like, may also be included in semiconductor substrate 20. Semiconductor substrate 20 may be formed of single-crystalline or compound materials, and may be a bulk substrate or a semiconductor-on-insulator (SOI) substrate.

Pad layer 22 and mask layer 24 are formed on semiconductor substrate 20. Pad layer 22 is preferably a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In the preferred embodiment, mask layer 24 is formed of silicon nitride, for example, using low-pressure chemical vapor deposition (LPCVD). In other embodiments, mask layer 24 is formed by thermal nitridation of silicon, plasma enhanced chemical vapor deposition (PECVD), or plasma anodic nitridation. Mask layer 24 is used as a hard mask during subsequent photolithography process. Photoresist 26 is formed on mask layer 24 and is then patterned to form opening 28.

Figure 4:
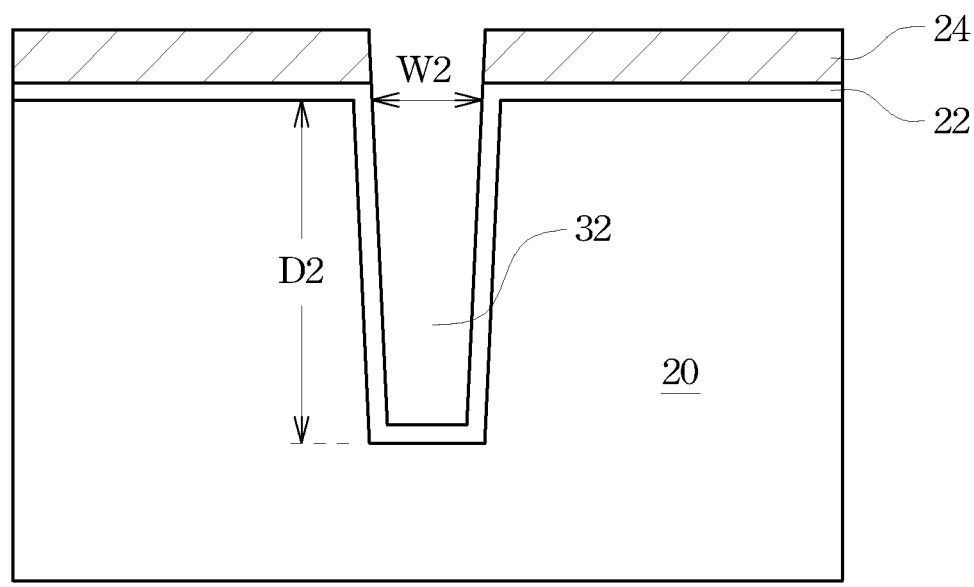

Referring to FIG. 4, mask layer 24 and pad layer 22 are etched through opening 28, exposing underlying semiconductor substrate 20. The exposed semiconductor substrate 20 is then etched, forming trench 32. Photoresist 26 is then removed. Next, a cleaning is preferably performed to remove a native oxide of semiconductor substrate 20. The cleaning may be performed using diluted HF. In an exemplary embodiment, the depth D2 of trench 32 is between about 2100 Å and about 2500 Å, while the width W2 is between about 42 Å and about 48 Å. One skilled in the art will realize, however, that the dimensions recited throughout the descriptions are merely examples, and may be changed to suit different scales of integrated circuits.

Figure 5:
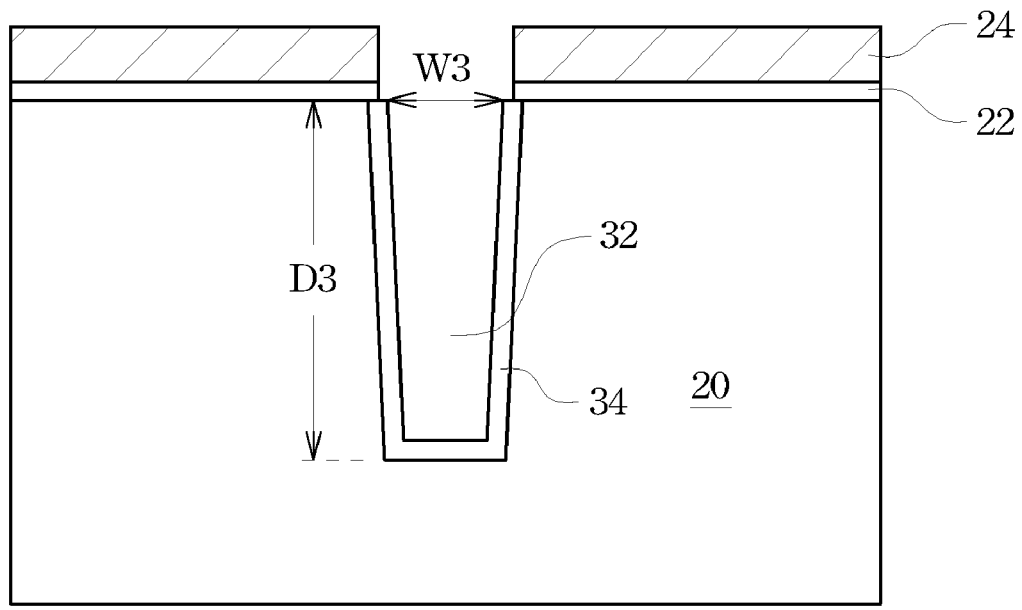

Liner oxide 34 is then formed in opening 32, as is shown in FIG. 5. In an embodiment, liner oxide 34 may be a thermal oxide having a preferred thickness of between about 20 Å to about 500 Å. In other embodiments, liner oxide 34 is formed using in-situ steam generation (ISSG). Alternatively, liner oxide 34 may be formed using a deposition technique that can form conformal oxide layers, such as selective area chemical vapor deposition (SACVD), high aspect ratio process (HARP), and the like. The formation of liner oxide 34 rounds the corners of opening 32, which reduces the electrical fields, and hence improves the performance of the resulting integrated circuit.

After the formation of liner oxide 34, the remaining portion of opening 32 has a width W3, which is measured at the same level as a top surface of substrate 20, and a depth D3. Throughout the description, the ratio of depth D3 to width W3 is referred to the aspect ratio of opening 32. In an exemplary embodiment, the aspect ratio is greater than about 7.0, for example, between about 7.0 and about 8.5. In other exemplary embodiments, the aspect ratios may even be greater than about 8.5, although they may also be lower than about 7.0.

Figure 6A:
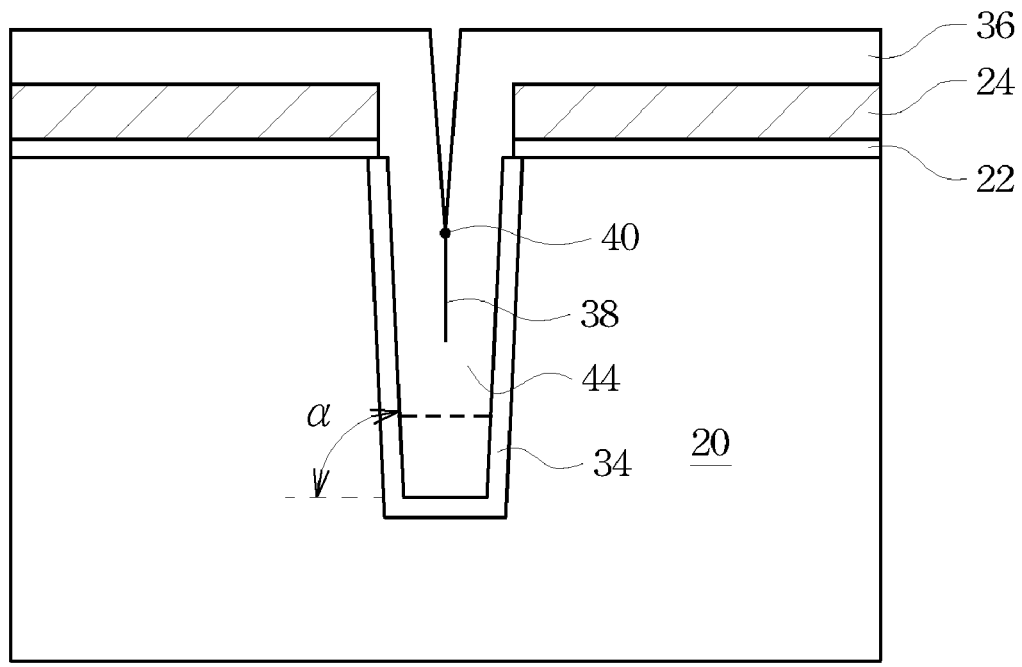

Referring to FIG. 6A, opening 32 is at least partially filled with dielectric material 36. Preferably, dielectric material 36 includes silicon oxide, and hence is referred to as oxide 36 throughout the description, although other dielectric materials, such as SiN, SiC, or the like, may also be used. Oxide 36 may be filled using a conformal deposition technique, which results in a highly conformal layer. In an exemplary embodiment, oxide 36 is formed using HARP. As a result of the conformal deposition technique, the dielectric material is grown on the sidewalls of STI opening 32 in a deposition rate close to the deposition rate at the bottom, and the sidewall portions of oxide 36 join each other to form seam 38 in the center of STI opening 32. Since the sidewalls of STI opening 32 typically have a tilt angle α of less than 90 degrees, seam 38 may grow upward when the deposition proceeds. In other words, top joint 40, at which opposing sidewall portions of oxide 36 meets, may move upward when the deposition proceeds.

Figure 6B:
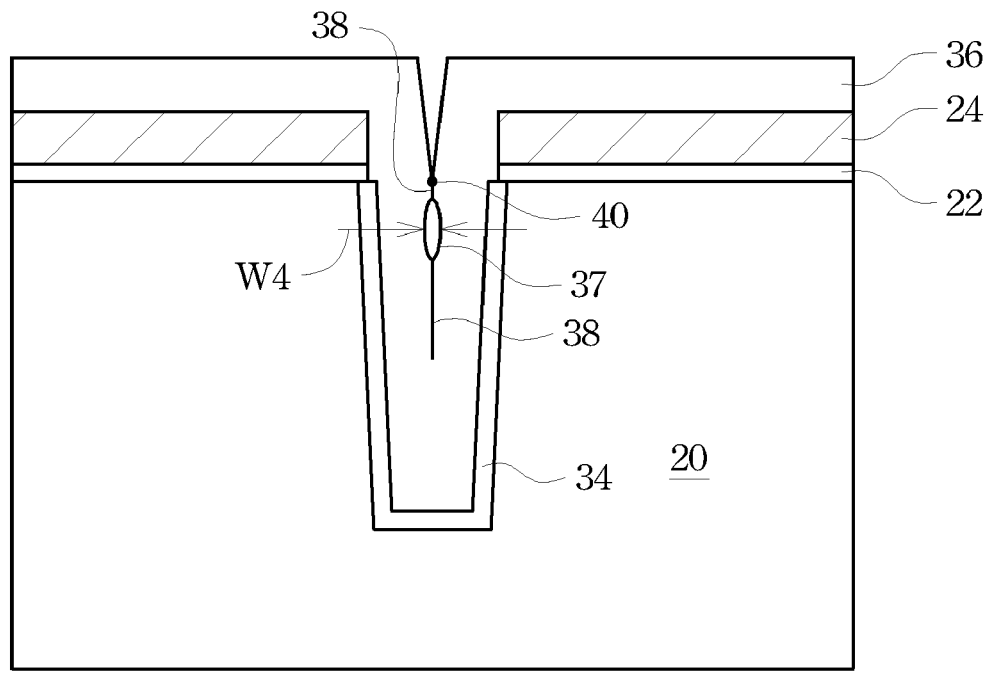

Oxide 36 may include void 37, as shown in FIG. 6B. Preferably, void 37 is narrow, with a width W4 of less than about 5 Å, so that it may be eliminated in subsequent treatment and anneal processes.

In an embodiment of the present invention, before top joint 40 moves to a level higher than the top surface of substrate 20, the filling of oxide 36 is paused, and (a first) treatment is performed. The treatment provides an energy high enough for breaking bonds in oxide 36. In an embodiment of the present invention, the energy is provided by ultra-violet (UV) light. Preferably, the UV light has a wavelength of less than about 250 nm. Accordingly, the energy provided by the UV light is greater than about 5.21 eV, which is great enough for breaking the C—O bonds in oxide 36. In alternative embodiments, the treatment is performed after the top joint 40 has grown to a level higher than the top surface of substrate 20.

Figure 7A:
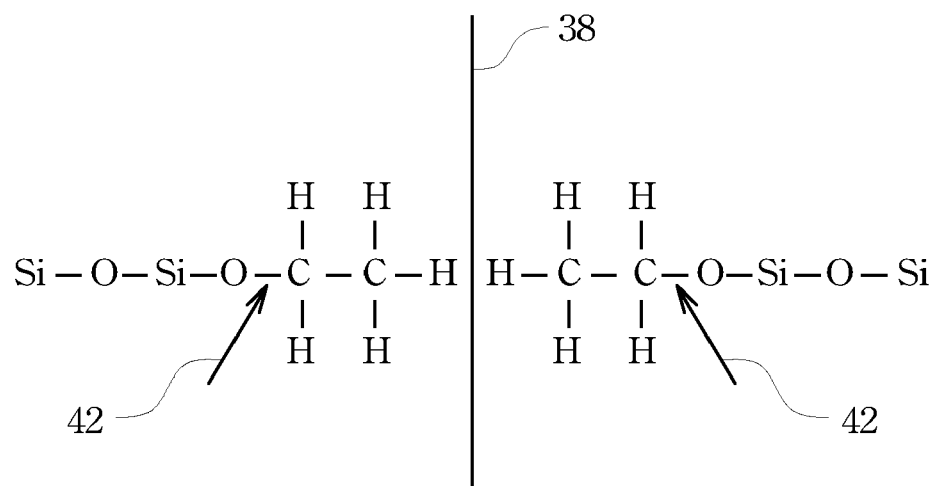
FIGS. 7A through 7C schematically illustrate bonds on opposing sides of seams.

FIG. 7A schematically illustrates the bonds at seam 38. In the following examples, C—O bonds and $C_2H_5$ terminals are used as examples to explain the concept of the present invention. However, STI regions may be formed of different materials, and the corresponding bonds may be different. The concept of the present invention, however, may still apply, except the energy required for breaking bonds may be different. On both sides of seam 38, there may exist C—O bonds (pointed by arrows 42), and inactive terminals such as $C_2H_5$. In addition, there might also be other types of bonds, such as Si—OH bonds and Si—O—Si bonds. By providing energy through the treatment, bonds 42 may be broken. The oxygen atoms are thus activated, with dangling bonds formed.

In alternative embodiments, the treatment may be performed by implanting inert gases, such as nitrogen, argon, and the like. In yet other embodiments, the treatment may be performed by implanting oxygen, which may be an essential element in oxide 36. The energy of the implanted atoms/ions may also break the bonds in oxide 36. In yet other embodiments, other treatment methods that may provide enough energy for breaking C—O bonds and activating oxygen atoms, such as e-Beam, may be used.

Referring back to FIG. 6A, to reduce the likely damage to substrate 20, the treated portion of oxide 36 is preferably deep enough to include all weak seam 38, but higher than the bottom of STI opening 32. In other words, if the implantation is performed, the bottom border 44 of the implanted (treated) portion of oxide 36 is between the weak seam 38 and the bottom of STI opening 32. Accordingly, the portion of oxide 36 over border 44 is treated, while the portion of oxide 36 under border 44 is not treated. In other embodiments, bottom border 44 may be higher than the bottom of seam 38.

Figure 8:
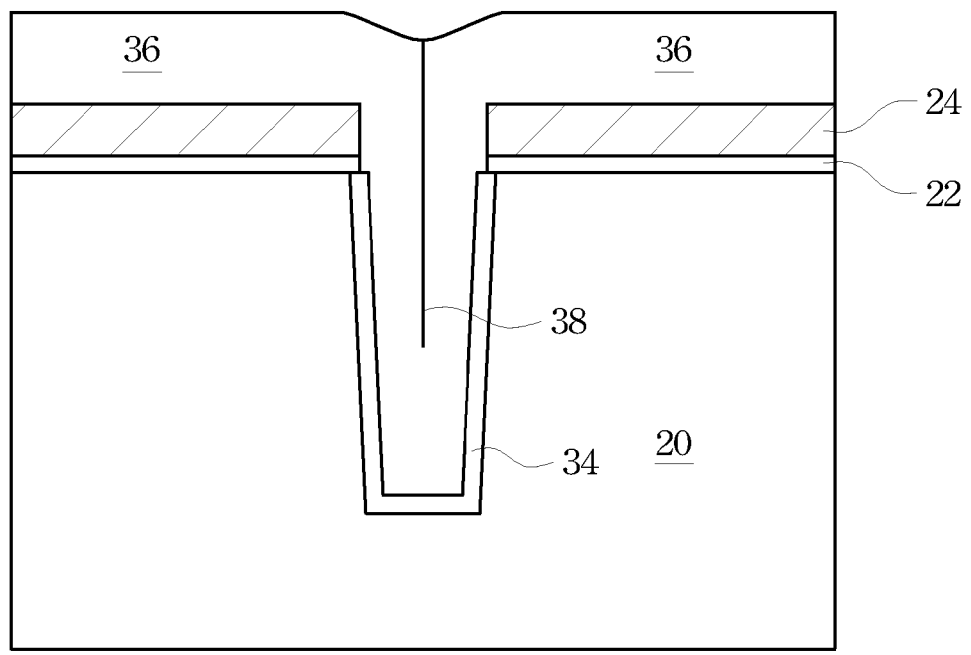

Referring to FIG. 8, the remaining portion of opening 32 is filled, preferably using a same material as oxide 36, although different materials than that of oxide 36, such as SiON, SiN, or the like, may also be used. The continued filling of STI opening 32 is preferably performed using HARP. Alternatively, other conformal deposition methods, such as high-density plasma chemical vapor deposition (HDP), SACVD, or atmospheric pressure chemical vapor deposition (APCVD), may be used.

A second treatment may then be performed. The second treatment may use essentially a same method as used in the first treatment. Again, the undesirable bonds connecting undesirable terminals, such as C—O bonds may be broken by the second treatment, and oxygen atoms may be activated.

Figure 7B:
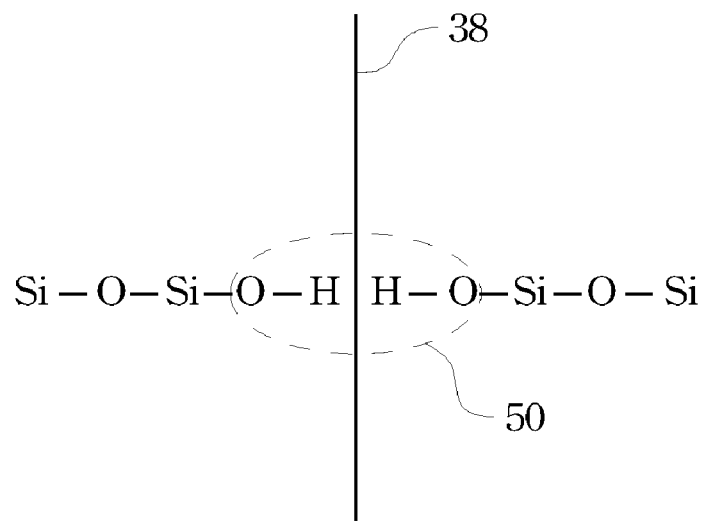

Next, a steam anneal is performed. The steam anneal may include annealing the structure shown in FIG. 8 at an elevated temperature, for example, between about 600° C. and about 700° C., with steam ($H_2O$) introduced. As shown in FIG. 7B, the dangling oxygen bond may bond with a hydrogen atom in $H_2O$, forming OH terminals. The dangling terminals ($C_2H_5$) may form a bond with OH in $H_2O$, and are removed. As a result, both sides of seam 38 may include Si—OH terminals.

Figure 7C:
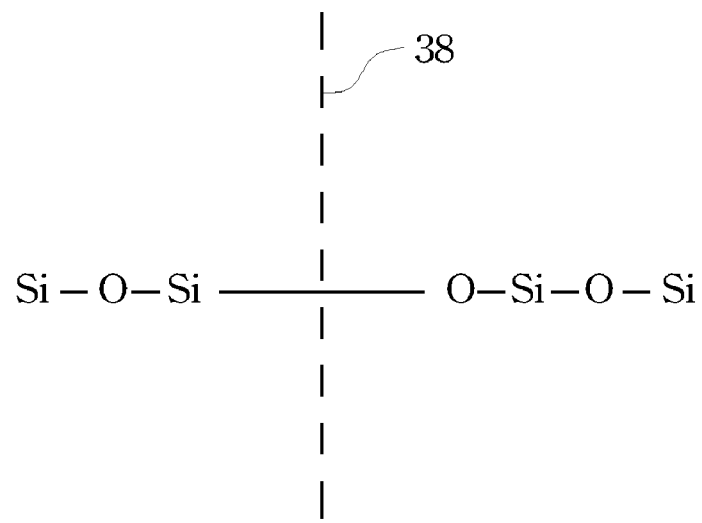
Figure 9:
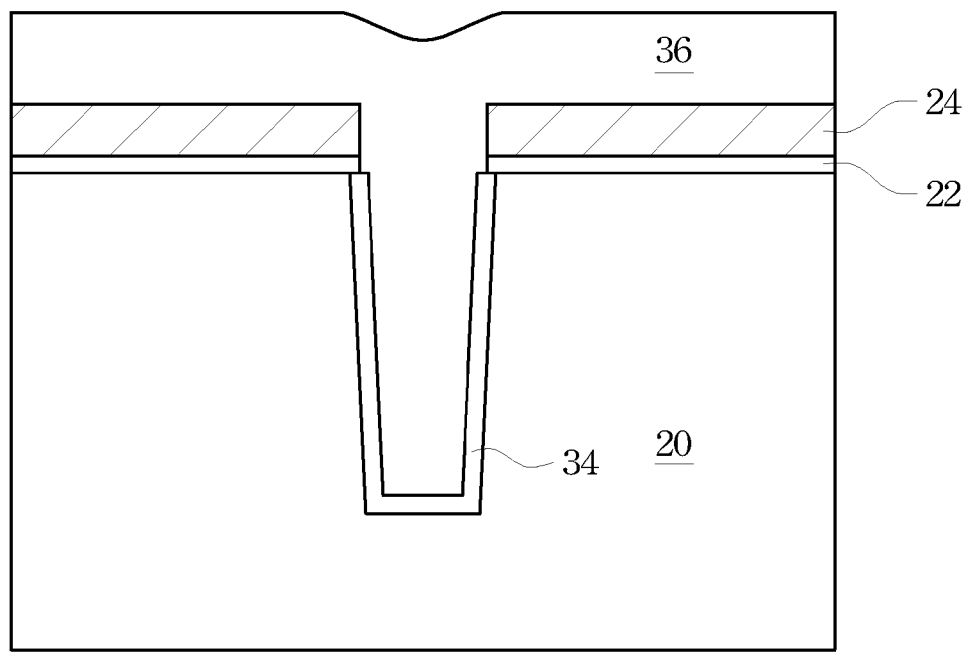

After the steam anneal, a dry anneal may be performed, for example, at about 1050° C. Accordingly, the materials having the OH terminals (as shown in FIG. 7B) may be decomposed, forming silicon oxides, in which Si—OH on opposing sides of seam 38 form Si—O—Si bonds. The hydrogen and oxygen atoms in the Si—OH form $H_2O$ and are removed (refer to 50 in FIG. 7B). As a result, as shown in FIG. 7C, the silicon atoms on opposing sides of the seam 38 are tightly joined, resulting in improved mechanical strength. The resulting structure is shown in FIG. 9, in which seam 38 is at least substantially, possibly fully, eliminated.

The embodiments of the present invention may include many variations. For example, instead of having two treatments, there may only be one treatment, preferably performed after all of oxide 36 is formed, as shown in FIG. 8. The only one treatment may also be performed after the top joint 40 is higher the top surface of substrate 20 (refer to FIG. 6B). In other embodiments, more than two treatments may be performed, each being performed after a layer of oxide 36 is formed. In yet other embodiments, instead of having only one steam anneal, a plurality of steam anneals may be performed, with one steam anneal after each of the treatments. Advantageously, with multiple treatments (steam anneals), oxygen can be activated more thoroughly, although the production cost is increased.

Figure 10:
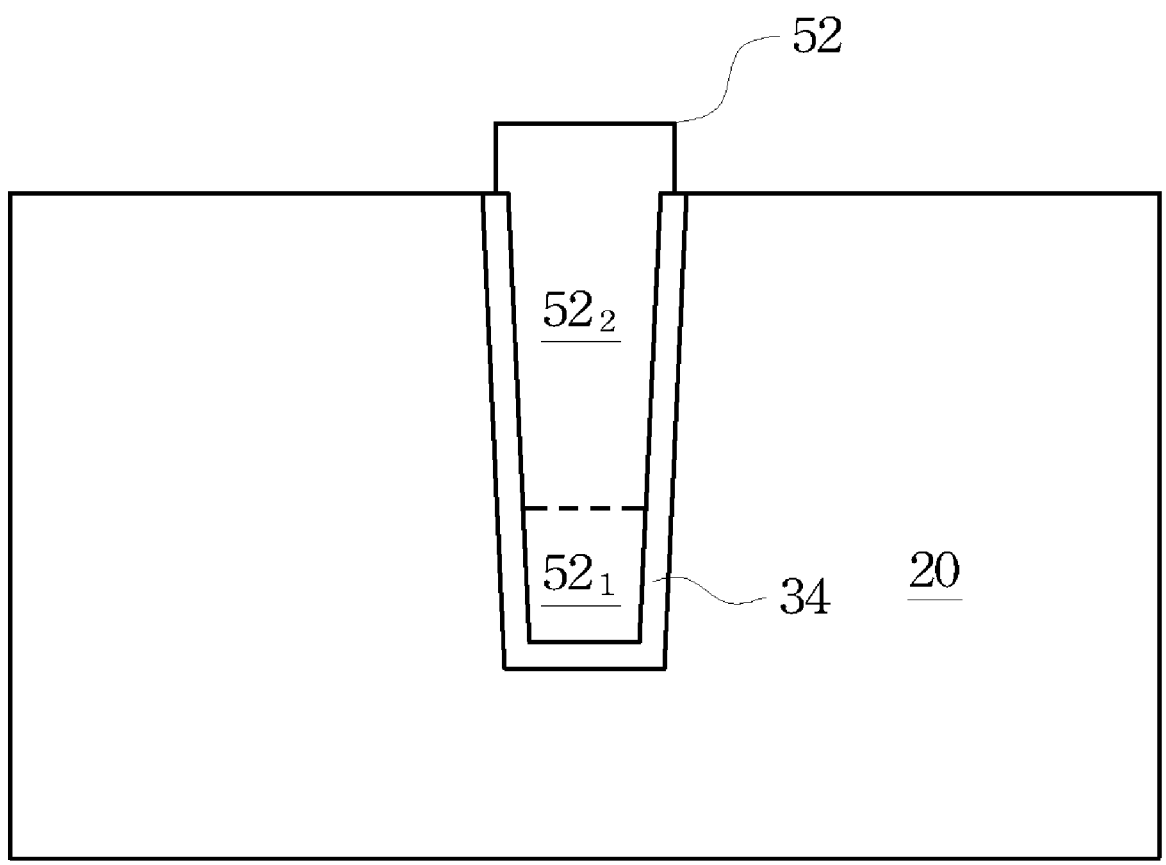

A chemical mechanical polish (CMP) is then performed to remove excess oxide 36, forming a structure as shown in FIG. 10. Mask layer 24 (refer to FIG. 9) may act as a CMP stop layer. The remaining portion of oxide 36 forms STI region 52.

Mask layer 24 and pad layer 22 are then removed, as also shown in FIG. 10. Mask layer 24, if formed of silicon nitride, may be removed by a wet clean process using hot $H_3PO_4$, while pad layer 22 may be removed using diluted HF if formed of silicon oxide. As is known in the art, the removal of mask layer 24 and pad layer 22 and the corresponding cleaning processes will cause the top surface of STI region 42 to be lowered.

As the result of the treatments, after the steam anneal and the dry anneal, the resulting STI regions may include an upper portion $52_2$ and a bottom portion $52_1$, wherein the upper portion $52_2$ is treated, while the bottom portion $52_1$ is not treated. With better bonds, the upper portion $52_2$ has a higher density, and a lower etching rate, than the bottom portion $52_1$.

The embodiments of the present invention have several advantageous features. By providing the energy to break C—O bonds, the efficiency of the subsequent steam anneal is improved. STI regions having high aspect ratios can hence be formed without voids and/or seams. In experiments, STI regions with aspect ratios of about 8.5 have been made with no voids and seams observed. The embodiments of the present invention thus enable the formation of STI regions for 40 nm technology and below, which demands STI regions to have high aspect ratios.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure, the method comprising:
   providing a semiconductor substrate comprising a top surface;
   forming an opening extending from the top surface into the semiconductor substrate;
   performing a conformal deposition method to fill a dielectric material into the opening;
   performing a first treatment on the dielectric material, wherein the first treatment comprises an implantation to the dielectric material; and
   after the first treatment, performing a steam anneal on the dielectric material.

2. The method of claim 1, wherein the implantation comprises implanting inert gases into the dielectric material.

3. The method of claim 1, wherein the implantation comprises implanting oxygen into the dielectric material.

4. The method of claim 1, wherein the step of filling the dielectric material generates a seam in the dielectric material, and wherein the implantation is performed to a depth deeper than a bottom of the seam and shallower than a bottom surface of the opening.

5. The method of claim 4, wherein at the time the first treatment is performed, the seam has a top joint lower than the top surface of the semiconductor substrate.

6. The method of claim 1, wherein the conformal deposition method is a high aspect-ratio process (HARP).

7. The method of claim 6, wherein the opening has an aspect ratio of greater than 7.

8. The method of claim 1 further comprising:
   after the first treatment, filling an additional dielectric material into the opening and over the dielectric material; and
   before the steam anneal, performing a second treatment, wherein the second treatment provides an energy higher than an energy for breaking bonds in the additional dielectric material.

9. The method of claim 8, wherein the dielectric material and the additional dielectric material are silicon oxides.

10. The method of claim 1 further comprising performing a dry anneal after the steam anneal.

11. A method of forming an integrated circuit structure, the method comprising:
    providing a semiconductor substrate comprising a top surface;
    forming an opening extending from the top surface into the semiconductor substrate;
    forming a liner oxide in the opening;
    performing a high aspect-ratio process (HARP) to fill a silicon oxide into at least a portion of the opening, wherein the silicon oxide is over the liner oxide;
    performing a first treatment on the silicon oxide, wherein the first treatment comprises an implantation of a gas selected from the group consisting essentially of oxygen, nitrogen, argon, and combinations thereof;
    performing a steam anneal;
    performing a dry anneal after the steam anneal; and
    performing a planarization after the first treatment.

12. The method of claim 11, wherein the HARP generates a seam in a middle portion of the silicon oxide, and wherein the first treatment comprises an implantation of elements to a depth lower than a bottom of the seam and higher than a bottom surface of the opening.

13. The method of claim 12, wherein at the time the first treatment is performed, the seam has a top joint lower than the top surface of the semiconductor substrate.

14. The method of claim 12, wherein the seam has a top joint higher than the top surface of the semiconductor substrate.

15. The method of claim 11 further comprising:
    after the first treatment, filling an additional silicon oxide in the opening and over the silicon oxide; and
    before the steam anneal, performing a second treatment, wherein the second treatment breaks C—O bonds in the additional silicon oxide.

16. The method of claim 15 further comprising, after the first treatment and before the second treatment, performing an additional steam anneal.

17. A method of forming an integrated circuit structure, the method comprising:
    providing a semiconductor substrate comprising a top surface;
    forming an opening extending from the top surface into the semiconductor substrate;
    performing a conformal deposition method to fill a dielectric material into the opening;
    performing a first treatment on the dielectric material;
    after the first treatment, filling an additional dielectric material into the opening and over the dielectric material;
    after the step of filling the additional dielectric material, performing a second treatment; and
    performing a steam anneal on the dielectric material.

18. The method of claim 17, wherein the first treatment comprises a radiation of an ultraviolet light having a wavelength shorter than about 250 nm.

19. The method of claim 17, wherein the first treatment comprises a radiation using e-Beam.

\* \* \* \* \*